US012394885B2

(12) United States Patent
Kim et al.

(10) Patent No.: US 12,394,885 B2
(45) Date of Patent: Aug. 19, 2025

(54) ANTENNA PACKAGE AND IMAGE DISPLAY DEVICE INCLUDING THE SAME

(71) Applicant: DONGWOO FINE-CHEM CO., LTD., Jeollabuk-do (KR)

(72) Inventors: Na Yeon Kim, Seoul (KR); Young Ju Kim, Gyeonggi-do (KR); Byung Jin Choi, Incheon (KR)

(73) Assignee: DONGWOO FINE-CHEM CO., LTD., Jeollabuk-Do (KR)

(*) Notice: Subject to any disclaimer, the term of this patent is extended or adjusted under 35 U.S.C. 154(b) by 213 days.

(21) Appl. No.: 18/070,704

(22) Filed: Nov. 29, 2022

(65) Prior Publication Data

US 2023/0092067 A1 Mar. 23, 2023

Related U.S. Application Data

(63) Continuation of application No. PCT/KR2021/006805, filed on Jun. 1, 2021.

(30) Foreign Application Priority Data

Jun. 4, 2020 (KR) .................. 10-2020-0067482

(51) Int. Cl.
*H01Q 1/24* (2006.01)
*H01Q 1/38* (2006.01)
(Continued)

(52) U.S. Cl.
CPC .............. *H01Q 1/243* (2013.01); *H01Q 1/38* (2013.01); *H01Q 1/48* (2013.01); *H01Q 1/52* (2013.01);
(Continued)

(58) Field of Classification Search
CPC .. H01Q 1/38; H01Q 1/22; H01Q 1/44; H01Q 1/2283; H01Q 1/2291; H01Q 1/242; H01Q 1/243
See application file for complete search history.

(56) References Cited

U.S. PATENT DOCUMENTS 9,391,375 B1 * 7/2016 Bales ................... H01Q 21/064
10,062,972 B1 * 8/2018 Strassner, II ......... H01Q 21/065
(Continued)

FOREIGN PATENT DOCUMENTS

CN 111009723 A 4/2020
CN 216958495 U 7/2022
(Continued)

OTHER PUBLICATIONS

International Search Report for PCT/KR2021/006805 mailed on Sep. 6, 2021.
(Continued)

*Primary Examiner* — Wei (Victor) Y Chan
(74) *Attorney, Agent, or Firm* — The PL Law Group, PLLC (57) ABSTRACT

An antenna package according to an embodiment includes an antenna unit and a circuit board bonded to the antenna unit. The circuit board includes a core layer comprising a plurality of portions having different widths from each other in a planar view, the core layer having a first surface and a second surface opposing each other, and a circuit wiring disposed on the first surface of the core layer and electrically connected to the antenna unit.

16 Claims, 10 Drawing Sheets

(51) Int. Cl.
    *H01Q 1/48*       (2006.01)
    *H01Q 1/52*       (2006.01)
    *H01Q 21/08*     (2006.01)
    *H05K 1/02*       (2006.01)

(52) U.S. Cl.
    CPC ........... *H01Q 21/08* (2013.01); *H05K 1/0296* (2013.01); *H05K 2201/10098* (2013.01)

(56) References Cited

U.S. PATENT DOCUMENTS

| | | | |
|---|---|---|---|
| 11,789,140 B2* | 10/2023 | Wang | G01S 13/538 |
| | | | 342/109 |
| 12,003,034 B2* | 6/2024 | Baek | H01Q 21/28 |
| 12,068,810 B2* | 8/2024 | Choi | H01Q 1/48 |
| 2006/0170597 A1* | 8/2006 | Kurashima | H01Q 1/242 |
| | | | 343/795 |
| 2011/0050534 A1* | 3/2011 | Shimayama | H01P 5/028 |
| | | | 343/850 |
| 2011/0090129 A1* | 4/2011 | Weily | H01Q 21/24 |
| | | | 343/770 |
| 2011/0134008 A1* | 6/2011 | Schadler | H01Q 21/08 |
| | | | 343/843 |
| 2011/0304515 A1* | 12/2011 | Wellman | H01Q 21/061 |
| | | | 250/340 |
| 2015/0303585 A1* | 10/2015 | Chistyakov | H01Q 21/0006 |
| | | | 343/853 |
| 2016/0079666 A1* | 3/2016 | Camilleri | H01Q 3/24 |
| | | | 342/368 |
| 2018/0123222 A1* | 5/2018 | Jang | H01Q 19/005 |
| 2019/0058264 A1* | 2/2019 | Jung | H01Q 9/0435 |
| 2020/0119452 A1 | 4/2020 | Kylkilahti et al. | |
| 2020/0194896 A1* | 6/2020 | Huh | H01Q 1/48 |
| 2023/0187837 A1* | 6/2023 | Sakaida | H01Q 1/48 |
| | | | 343/846 |

FOREIGN PATENT DOCUMENTS

| | | |
|---|---|---|
| JP | 2007-37107 A | 2/2007 |
| KR | 10-2007-0012077 A | 1/2007 |
| KR | 10-2013-0095451 A | 8/2013 |
| KR | 10-1506275 B1 | 3/2015 |
| KR | 10-1962821 B1 | 7/2019 |
| KR | 10-2020-0010906 A | 1/2020 |
| KR | 10-2020-0039321 A | 4/2020 |
| WO | WO 2006/132032 A1 | 12/2006 |

OTHER PUBLICATIONS

Office action issued on Dec. 18, 2024 from China Patent Office in a counterpart China Patent Application No. 202110625928.9 (all the cited references are listed in this IDS.) (English translation is also submitted herewith.).

* cited by examiner

ANTENNA PACKAGE AND IMAGE DISPLAY DEVICE INCLUDING THE SAME

CROSS-REFERENCE TO RELATED APPLICATION AND CLAIM OF PRIORITY

The present application is a continuation application to International Application No. PCT/KR2021/006805 with an International Filing Date of Jun. 1, 2021, which claims the benefit of Korean Patent Application No. 10-2020-0067482 filed on Jun. 4, 2020 at the Korean Intellectual Property Office, the disclosures of which are incorporated by reference herein in their entirety.

BACKGROUND

1. Field

The present invention relates to an antenna package and an image display device including the same. More particularly, the present invention relates to an antenna package including an antenna device and a circuit board and an image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

As mobile communication technologies have been rapidly developed, an antenna capable of operating a high frequency or ultra-high frequency communication is needed in the image display device.

To implement a radiation driving of the antenna, a circuit board for a feeding and a control signal transmission may be connected to the antenna. The circuit board may be bent to be connected to, e.g., a driving integrated circuit chip. In this case, damages to circuit wirings and a connection failure with the antenna may be caused due to a bending stress.

Further, as a thickness of the image display device to which the antenna is combined recently decreases, a degree of bending of the circuit board may increase. In this case, the above-described bending defects may be further intensified. Accordingly, an antenna package design to enhance reliability of the bonding of the circuit board and the circuit connection while maintaining or improving radiation properties of the antenna.

For example, Korean Patent Application Publication No. 2013-0095451 discloses an antenna integrated with a display panel, but fails to suggest or provide any efficient circuit connection.

SUMMARY

According to an aspect of the present invention, there is provided an antenna package having improved electrical and mechanical reliability.

According to an aspect of the present invention, there is provided an image display device including an antenna package with improved electrical and mechanical reliability.

(1) An antenna package, including: an antenna unit; and a circuit board bonded to the antenna unit, wherein the circuit board includes: a core layer including a plurality of portions having different widths from each other in a planar view, the core layer having a first surface and a second surface opposing each other; and a circuit wiring disposed on the first surface of the core layer and electrically connected to the antenna unit.

(2) The antenna package of the above (1), wherein the core layer includes an antenna connection portion adjacent to the antenna unit and a circuit extension portion having a width smaller than that of the antenna connection portion.

(3) The antenna package of the above (2), wherein the antenna connection portion includes a bonding portion bonded to the antenna unit, and an intermediate portion disposed between the bonding portion and the circuit extension portion.

(4) The antenna package of the above (3), wherein the intermediate portion has a width smaller than that of the bonding portion and has a larger width than that of the circuit extension portion.

(5) The antenna package of the above (4), wherein the intermediate portion includes a first intermediate portion and a second intermediate portion which are sequentially positioned in a direction from the bonding portion to the circuit connection portion, and the second intermediate portion has a width smaller than that of the first intermediate portion.

(6) The antenna package of the above (5), wherein the antenna unit includes a plurality of antenna units, the circuit wiring includes first merge wirings coupling a predetermined number of antenna units among the plurality of the antenna units to each other, and a second merge wiring coupling the first merge wirings, and the first merge wirings are disposed on the first intermediate portion, and the second merge wiring is disposed on the second intermediate portion.

(7) The antenna package of the above (2), wherein the antenna unit includes a plurality of antenna units, and the circuit wiring includes a plurality of circuit wirings, each of which is independently connected to each of the plurality of the antenna units to continuously extend on the antenna connection portion and the circuit extension portion.

(8) The antenna package of the above (2), wherein the circuit wiring includes a plurality of circuit wirings, and the circuit board includes an opening formed in the antenna connection portion between the plurality of the circuit wirings.

(9) The antenna package of the above (2), wherein the circuit wiring includes a plurality of circuit wirings, and the circuit board includes a separation slit formed in the circuit extension portion between the plurality of the circuit wirings.

(10) The antenna package of the above (2), wherein the circuit board includes an open area continuously formed along the antenna connection portion and the circuit extension portion.

(11) The antenna package of the above (10), wherein the circuit wiring includes a plurality of circuit wirings, and the circuit board includes strip lines separated by the open area, and each of the plurality of the circuit wirings extends in each of the strip lines.

(12) The antenna package of the above (2), wherein the circuit wiring includes a plurality of circuit wirings disposed on the first surface of the core layer, and a distance between circuit wirings neighboring each other is at least three times each width of the plurality of the circuit wirings.

(13) The antenna package of the above (1), wherein the circuit wiring includes a plurality of circuit wirings, and the circuit board further includes a ground layer formed on the second surface of the core layer to commonly cover the plurality of the circuit wirings in a planar view.

(14) The antenna package of the above (1), wherein the antenna unit includes: a radiator; a transmission line extending from the radiator; a signal pad formed at an end portion of the transmission line and electrically connected to the circuit wiring of the circuit board; and a ground pad disposed around the signal pad to be separated from the signal pad and the transmission line.

(15) The antenna package of the above (14), wherein the circuit board further includes a bonding pad disposed around the circuit wiring on the first surface of the core layer.

(16) The antenna package of the above (15), wherein the bonding pad and the ground pad are bonded to each other.

(17) An image display device including the antenna package according to exemplary embodiments as described above.

According to exemplary embodiments of the present invention, a circuit board connected to an antenna unit may have a variable width. For example, a bending portion of the circuit board may have a relatively small width, and thus may be easily bent to be electrically connected to a driving integrated circuit chip.

In some embodiments, the circuit board may include an antenna connection portion having a large width and a circuit extension portion having a small width. A bonding stability with the antenna unit may be achieved by the antenna connection portion, and a bending stability may be improved by the circuit extension portion. The circuit board may include an open region, and bending property may be further improved.

DETAILED DESCRIPTION OF THE EMBODIMENTS

According to exemplary embodiments of the present invention, there is provided an antenna package including an antenna unit and a circuit board having a variable width. An image display device including the antenna package is also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

The terms "first", "second", "upper", "lower", "top", "bottom", etc., used in this application are not intended to designate an absolute position, but to relatively distinguish between different elements and positions.

Figure 1:
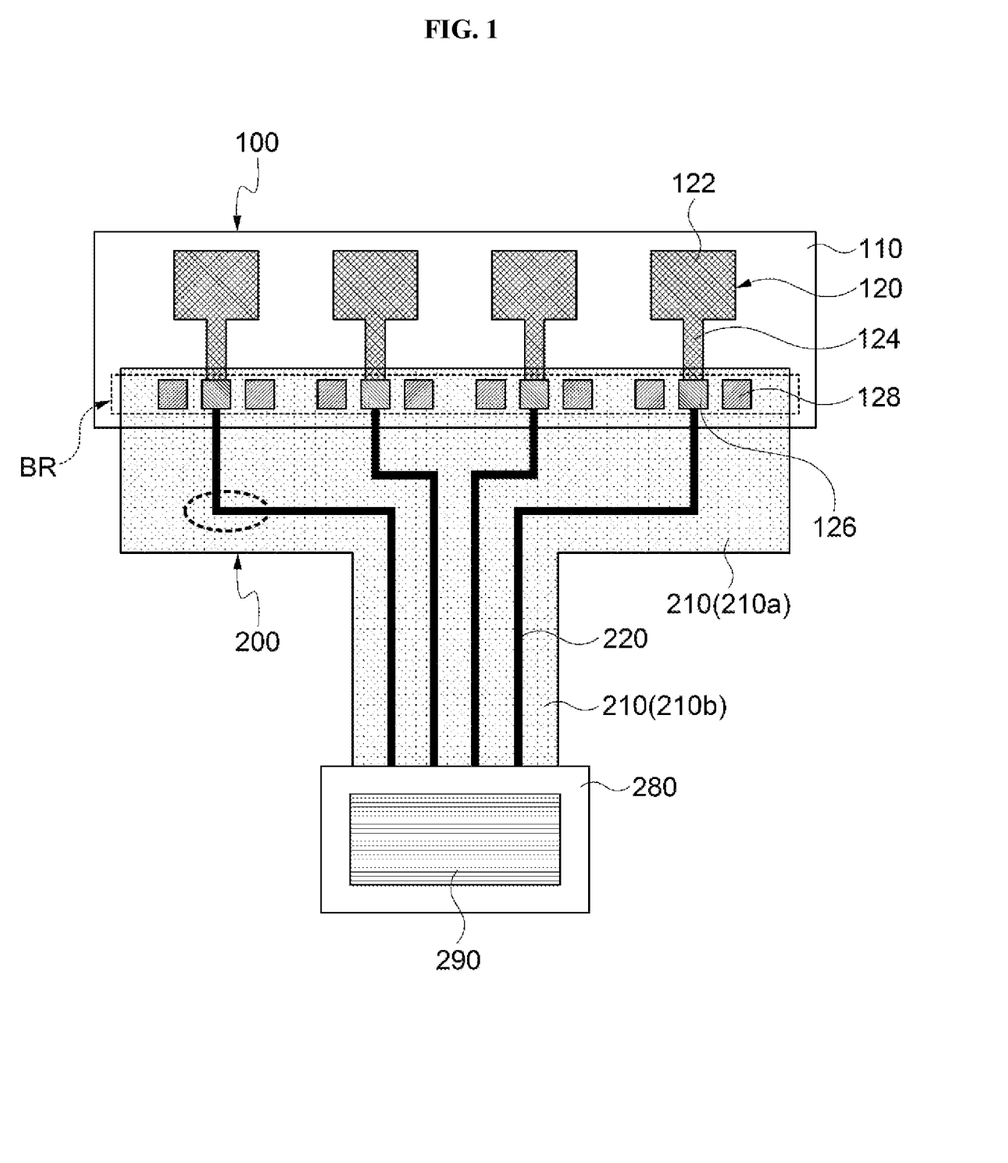
FIGS. 1 and 2 are a schematic top planar view and a schematic cross-sectional view, respectively, illustrating an antenna package in accordance with exemplary embodiments.
Figure 2:
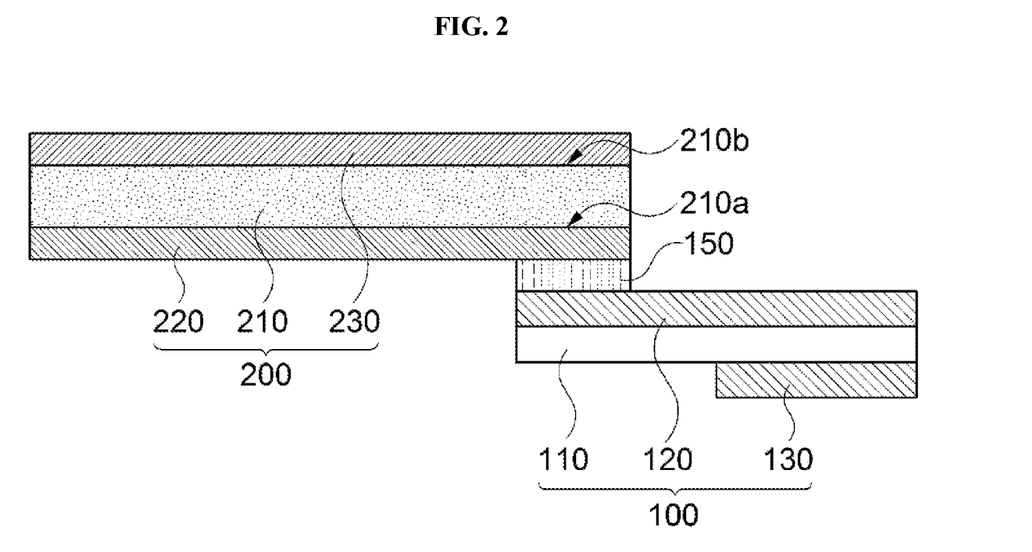

FIGS. 1 and 2 are a schematic top planar view and a schematic cross-sectional view, respectively, illustrating an antenna package in accordance with exemplary embodiments.

Referring to FIG. 1, the antenna package may include an antenna device 100 and a circuit board 200. The circuit board 200 may include a core layer 210 and a circuit wiring 220 formed on the core layer 210. The circuit wiring 220 and an antenna unit 120 included in the antenna device 100 may be electrically connected with each other.

The antenna device 100 may include an antenna dielectric layer 110 and the antenna unit 120 disposed on the antenna dielectric layer 110.

The antenna dielectric layer 110 may include, e.g., a transparent resin film such as a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more thereof.

The antenna dielectric layer 110 may include an adhesive material such as an optically clear adhesive (OCA), an optically clear resin (OCR), or the like. In some embodiments, the antenna dielectric layer 110 may include an inorganic insulating material such as glass, silicon oxide, silicon nitride, silicon oxynitride, etc.

In some embodiments, a dielectric constant of the antenna dielectric layer 110 may be adjusted in a range from about 1.5 to about 12. When the dielectric constant exceeds about 12, a driving frequency may be excessively decreased, so that driving in a desired high frequency or ultrahigh frequency band may not be implemented.

The antenna unit 120 may be formed on a top surface of the antenna dielectric layer 110. For example, a plurality of the antenna units 120 may be arranged in an array form along a width direction of the antenna dielectric layer 110 or the antenna package to form an antenna unit row.

The antenna unit 120 may include a radiator 122 and a transmission line 124. The radiator 122 may have, e.g., a polygonal plate shape, and the transmission line 124 may extend from one side of the radiator 122. The transmission line 124 may be formed as a single member substantially integral with the radiator 122.

The antenna unit 120 may further include a signal pad 126. The signal pad 126 may be connected to an end portion of the transmission line 124. In an embodiment, the signal pad 126 may be formed as a member substantially integral with the transmission line 124, and the end portion of the transmission line 124 may serve as the signal pad 126.

In some embodiments, a ground pad 128 may be disposed around the signal pad 126. For example, a pair of the ground pads 128 may face each other with the signal pad 126 interposed therebetween.

For example, the ground pad 128 may be electrically and physically separated from the transmission line 124 around the signal pad 126.

In exemplary embodiments, the antenna unit 120 or the radiator 122 may provide signal transmission/reception in a high frequency or ultra-high frequency band (e.g., a 3G, 4G, 5G or higher communication). In a non-limiting example, a resonance frequency of the antenna unit 120 may be from about 20 to 30 GHz (e.g., about 28 GHz) or from about 30 to 40 GHz (e.g., about 38 GHz).

The antenna unit 120 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in combination thereof.

In an embodiment, the antenna unit 120 may include silver (Ag) or a silver alloy (e.g., silver-palladium-copper (APC)), or copper (Cu) or a copper alloy (e.g., a copper-calcium (CuCa)) to implement a low resistance and a fine line width pattern.

The antenna unit 120 may include a transparent conductive oxide such as indium tin oxide (ITO), indium zinc oxide (IZO), zinc oxide (ZnOx), indium zinc tin oxide (IZTO), etc.

In some embodiments, the antenna unit 120 may include a stacked structure of a transparent conductive oxide layer and a metal layer. For example, the antenna unit 120 may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

In some embodiments, the radiator 122 and the transmission line 124 may include a mesh-pattern structure to improve transmittance. In this case, a dummy mesh pattern (not illustrated) may be formed around the radiator 122 and the transmission line 124.

The signal pad 126 and the antenna ground pad 125 may be solid patterns formed of the above-described metal or alloy in consideration of reduction of a feeding resistance, improvement of noise absorption efficiency, etc.

The circuit board 200 may include the core layer 210 and the circuit wirings 220 formed on a surface of the core layer 210. For example, the circuit board 200 may be a flexible printed circuit board (FPCB).

The core layer 210 may include, e.g., a flexible resin such as polyimide resin, Modified Polyimide (MPI), epoxy resin, polyester, cycloolefin polymer (COP), liquid crystal polymer (LCP), or the like. The core layer 210 may include an inner insulation layer included in the circuit board 200.

The circuit wiring 220 may be arranged on a first surface 210a of the core layer 210 (e.g., a bottom surface of the core layer 210 in FIG. 2). For example, the circuit board 200 may further include a coverlay film that may be formed on the first surface 210a of the core layer 210 to cover the circuit wiring 220.

The circuit wiring 220 may serve as an antenna feed wiring. For example, the coverlay film of the circuit board 200 may be partially removed to expose an end portion of the circuit wiring 220. The exposed end portion of the circuit wiring 220 may be bonded onto the signal pad 126.

For example, a conductive intermediate structure 150 such as an anisotropic conductive film (ACF) may be attached commonly on the signal pads 126 and the ground pads 128, and then a bonding region BR of the circuit board 200 in which the exposed end portions of the circuit wirings 220 are located may be disposed on the conductive intermediate structure 150. Thereafter, the bonding region BR of the circuit board 200 may be attached to the antenna device 100 through a heat treatment/pressurization process, such that the circuit wiring 220 may be electrically connected to each signal pad 126.

The ground pads 128 may be arranged around the signal pad 126, so that an adhesion to the anisotropic conductive film (ACF) may be enhanced and bonding stability may be improved.

As illustrated in FIG. 1, the circuit wirings 220 may each be individually and independently connected to each antenna unit 120. Accordingly, a power supply/driving control may be independently performed for each of the plurality of the antenna units 120. For example, different phase signals may be applied to the antenna units 120 through the circuit wirings 220 connected to each of the antenna units 120.

The circuit board 200 or the core layer 210 may have a variable width. In exemplary embodiments, the circuit board 200 or the core layer 210 may include an antenna connection portion 210a and a circuit extension portion 210b having different widths.

One end portion of the antenna connection portion 210a may include the bonding region BR, and may be bonded to the pads 126 and 128 of the antenna device 100 via the bonding region BR.

The circuit wirings 220 may extend from the bonding region BR toward an opposite end portion of the circuit board 200. For example, the circuit wiring 220 may include a bent portion (as indicated by a dashed ellipse in FIG. 1) on the antenna connection portion 210a to enter the circuit extension portion 210b.

In exemplary embodiments, the circuit extension portion 210b may have a width smaller than that of the antenna connection portion 210a. As described above, the circuit wirings 220 may extend on the circuit extension portion 210b by the bent portions with a relatively narrow interval therebetween.

An antenna driving integrated circuit (IC) chip 290 may be mounted on the circuit extension portion 210b or the opposite end portion of the circuit board 200 to be electrically connected to the circuit wirings 220. Accordingly, feeding and driving signals may be applied to the antenna unit 120 via the circuit wiring 220 by the antenna driving IC chip 290.

In some embodiments, an intermediate circuit board 280 is disposed on the opposite end portion of the circuit extension portion 210b, and an antenna driving IC chip 290 may be disposed on the intermediate circuit board 280 using, e.g., a surface mounting technology (SMT).

For example, the intermediate circuit board 280 may have a higher strength or a lower ductility than that of the circuit board 200. Accordingly, a mounting stability of the antenna driving IC chip 290 may be improved. For example, the intermediate circuit board 280 may include a core layer formed of a resin impregnated with an inorganic material such as glass fiber (e.g., a prepreg), and intermediate circuits formed in the core layer.

As described above, the circuit board 200 may include a plurality of portions having different widths. In exemplary embodiments, sufficient bonding stability with the antenna device 100 may be achieved through the antenna connection portion 210a having a relatively large width. Additionally, a sufficient spacing between the circuit wirings 220 in the antenna connection portion 210a may be maintained, so that the independence of the feeding/signal applied to each antenna unit 120 may be improved Further, flexible and circuit connection properties of the antenna package may be improved through the circuit extension portion 210b having a relatively small width. For example, the antenna driving IC chip 290 may be disposed at a rear side of the image display device, and the antenna device 100 may be disposed on a front side of the image display device.

In this case, the circuit extension portion 210b may be bent toward the rear side of the image display device to facilitate a circuit connection with the antenna driving IC chip 290. Further, mechanical damages to the circuit wirings 220 due to a stress propagation caused by an excessive increase of a bent area may be prevented, and thus the feeding and signal application with low resistance may be implemented with high reliability.

As illustrated in FIG. 2, a ground layer 230 may be disposed on the second surface 210b of the core layer 210. The ground layer 230 may commonly cover the circuit wirings 220 in a planar view. Noise and signal interference around the circuit wiring 220 may be absorbed or shielded by the ground layer 230. Additionally, generation of an electric field from the circuit wiring 220 may be promoted by the ground layer 230, thereby improving a signal transmission efficiency.

While reducing the width of the circuit extension portion 210b as described above, a gap between the circuit wirings 220 may be maintained to implement the sufficient electric field generation by the ground layer 230. In some embodiments, a distance between the circuit wirings 220 neighboring each other on the circuit extension portion 210b may be three times or more of a line width of each circuit wiring 220.

In some embodiments, an antenna ground layer 130 may be formed on a bottom surface of the antenna dielectric layer 110. The antenna ground layer 130 may overlap the radiator 122 of the antenna unit 120 in a thickness direction. A substantially vertical radiation antenna may be implemented by generating an electric field or inductance between the radiator 122 and the antenna ground layer 130.

In an embodiment, the antenna ground layer 130 may entirely cover the radiator 122 in a planar view and may not overlap the pads 126 and 128.

The circuit wiring 220, the ground layer 230 and the antenna ground layer 130 described above may include the above-described metal and/or alloy.

In an embodiment, a conductive member of a display device to which the antenna package is applied may serve as the antenna ground layer 130.

The conductive member may include, e.g., a gate electrode of a thin film transistor (TFT) included in a display panel, various wirings such as a scan line or a data line or various electrodes such as a pixel electrode or a common electrode.

In an embodiment, a metallic member such as a SUS plate, a sensor member such as a digitizer, a heat dissipation sheet, etc., disposed at a rear portion of the display device may serve as the antenna ground layer 130.

Figure 3:
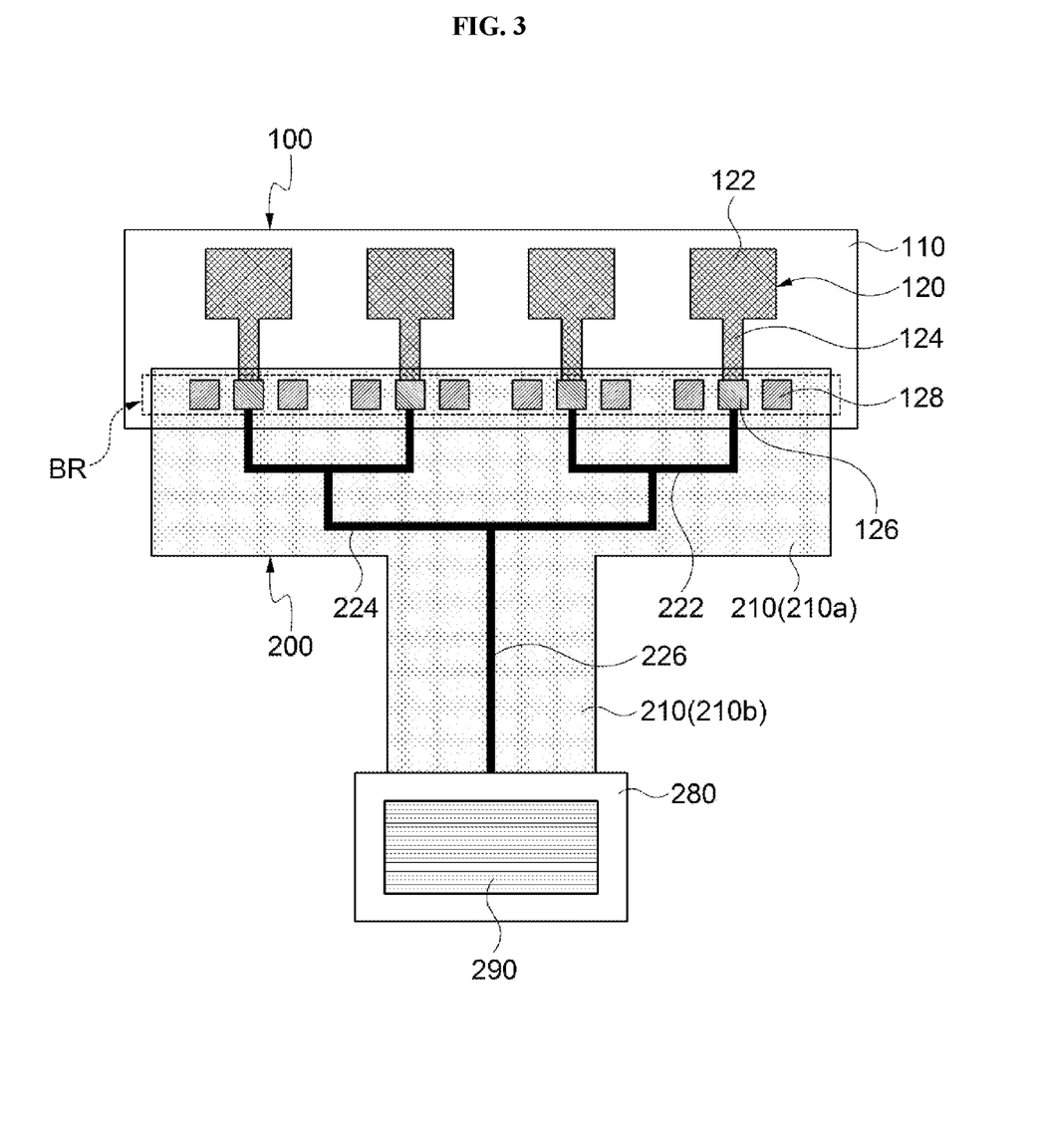
FIG. 3 is a schematic top planar view illustrating an antenna package in accordance with exemplary embodiments.

FIG. 3 is a schematic top planar view illustrating an antenna package in accordance with exemplary embodiments.

Referring to FIG. 3, a plurality of the antenna units 120 may be coupled by a circuit wiring. For example, the circuit wiring may include merge wirings 222 and 224 and a driving signal wiring 226.

The merge wirings 222 and 224 may be disposed on the antenna connection portion 210a of the circuit board 200 and may include a first merge wiring 222 and a second merge wiring 224. The first merge wiring 222 may be bonded with the signal pad 126 of the antenna unit 120. For example, two radiators 120 may be coupled by the first merge wiring 222 to form a radiation group. The second merge wiring 224 may be connected to a plurality of the first merge wirings 222 to combine the plurality of the radiation groups with each other.

An end portion of the driving signal wiring 226 may be branched from the second merge wiring 224. The driving signal wiring 226 may extend on the circuit extension portion 210b, and an opposite end portion of the driving signal wiring 226 may be electrically connected to the antenna driving IC chip 290.

The coupling construction of the antenna units 110 illustrated in FIG. 3 is an example, and may be appropriately changed in consideration of a size and a radiation type of the antenna device.

Figure 4:
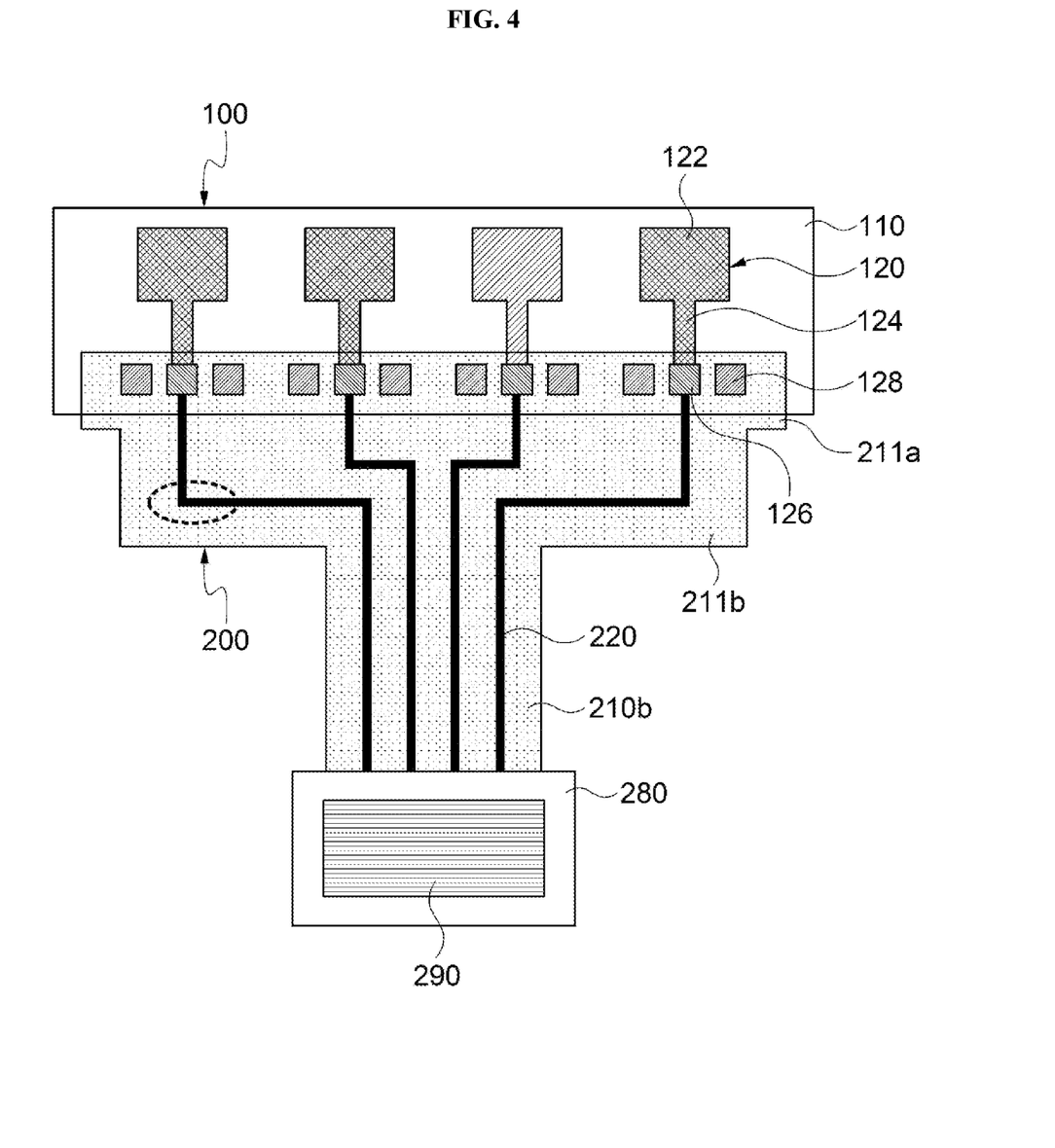
FIGS. 4 and 5 are schematic top planar views illustrating antenna packages in accordance with some exemplary embodiments.
Figure 5:
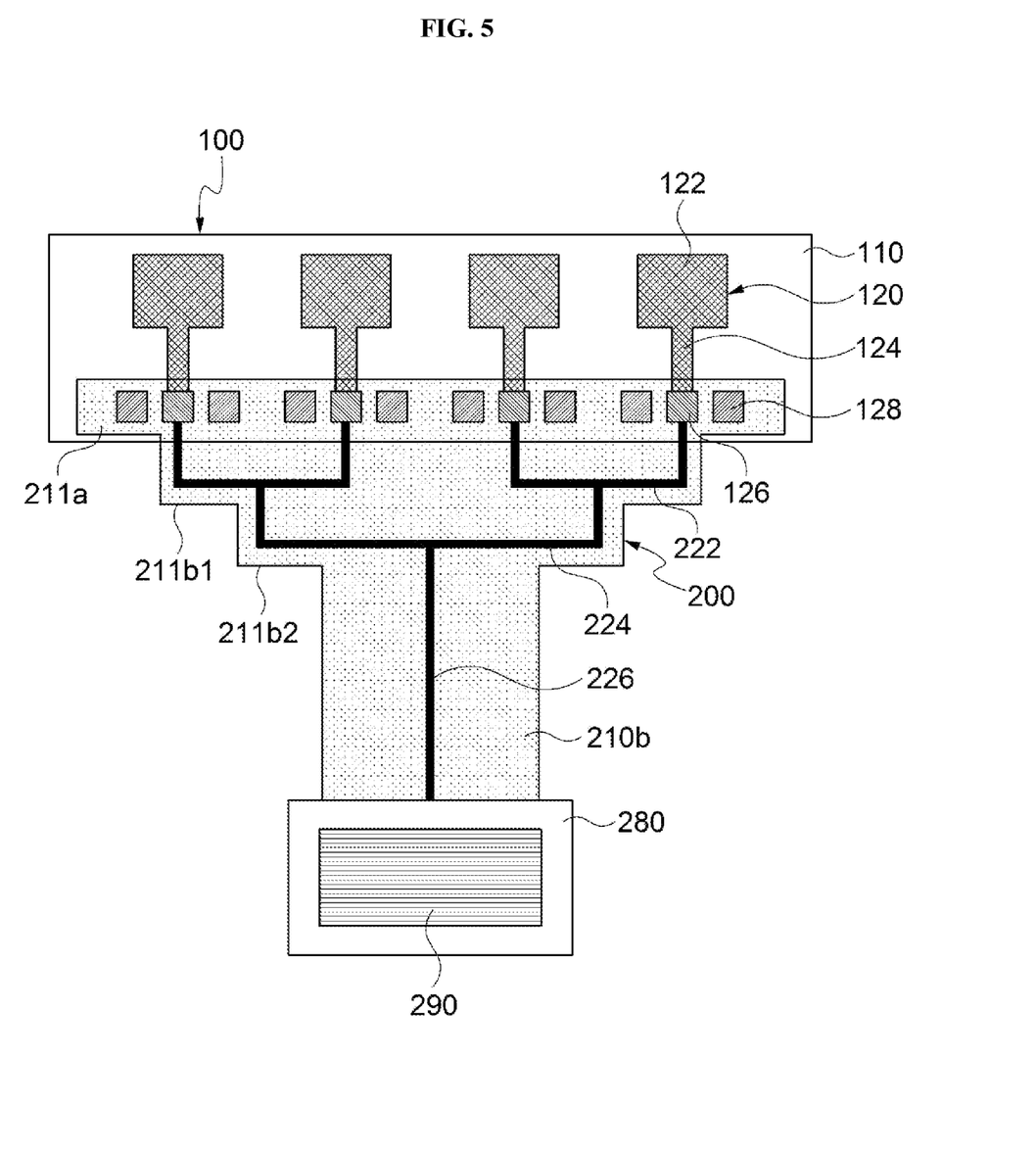

FIGS. 4 and 5 are schematic top planar views illustrating antenna packages in accordance with some exemplary embodiments.

Referring to FIG. 4, the antenna connection portion 210a described above may also include a plurality of portions having different widths. In exemplary embodiments, the antenna connection portion may include a bonding portion 211a and an intermediate portion 211b.

The bonding portion 211a may include the bonding region BR illustrated in FIG. 1 and may have a sufficient width to cover all of the pads 126 and 128 included in the antenna device 100.

The intermediate portion 211b may have a width smaller than that of the bonding portion 211a. In exemplary embodiments, bent portions of the circuit wirings 220 indicated by a dotted ellipse may be disposed on the intermediate portion 211b. In exemplary embodiments, the intermediate portion 211b may have a larger width than that of the circuit extension portion 210b.

Referring to FIG. 5, as also described with reference to FIG. 3, the circuit wirings may include the merge wirings 222 and 224 and the driving signal wiring 226. The antenna connection portion of the circuit board 200 may include the bonding portion 211a and the intermediate portion as described with reference to FIG. 4.

In exemplary embodiments, the intermediate portion may also include a plurality of portions having different widths.

For example, the intermediate portion may include a first intermediate portion 211b1 and a second intermediate portion 211b2.

The first intermediate portion 211b1 may extend from the bonding portion 211a and may have a width smaller than that of the bonding portion 211a. In an embodiment, the first merge wiring 222 may be disposed on the first intermediate portion 211b1.

The second intermediate portion 211b2 may be disposed between the first intermediate portion 211b1 and the circuit extension portion 210b. The second intermediate portion 211b2 may have a width smaller than that of the first intermediate portion 211b1 and may have a larger width than the circuit extension portion 210b. In an embodiment, the second merge wiring 224 may be disposed on the second intermediate portion 211b2.

As described with reference to embodiments of FIGS. 4 and 5, the intermediate portion may be disposed between the bonding portion 211a and the circuit extension portion 210b of the circuit board 200 to sequentially decrease the width of the circuit board. For example, as illustrated in FIG. 5, the circuit board 200 may have a stepped structure in a planar view.

Accordingly, a bending stress may be sequentially distributed and buffered in the circuit board 200, and mechanical stability against the bending stress may be further improved.

Figure 6:
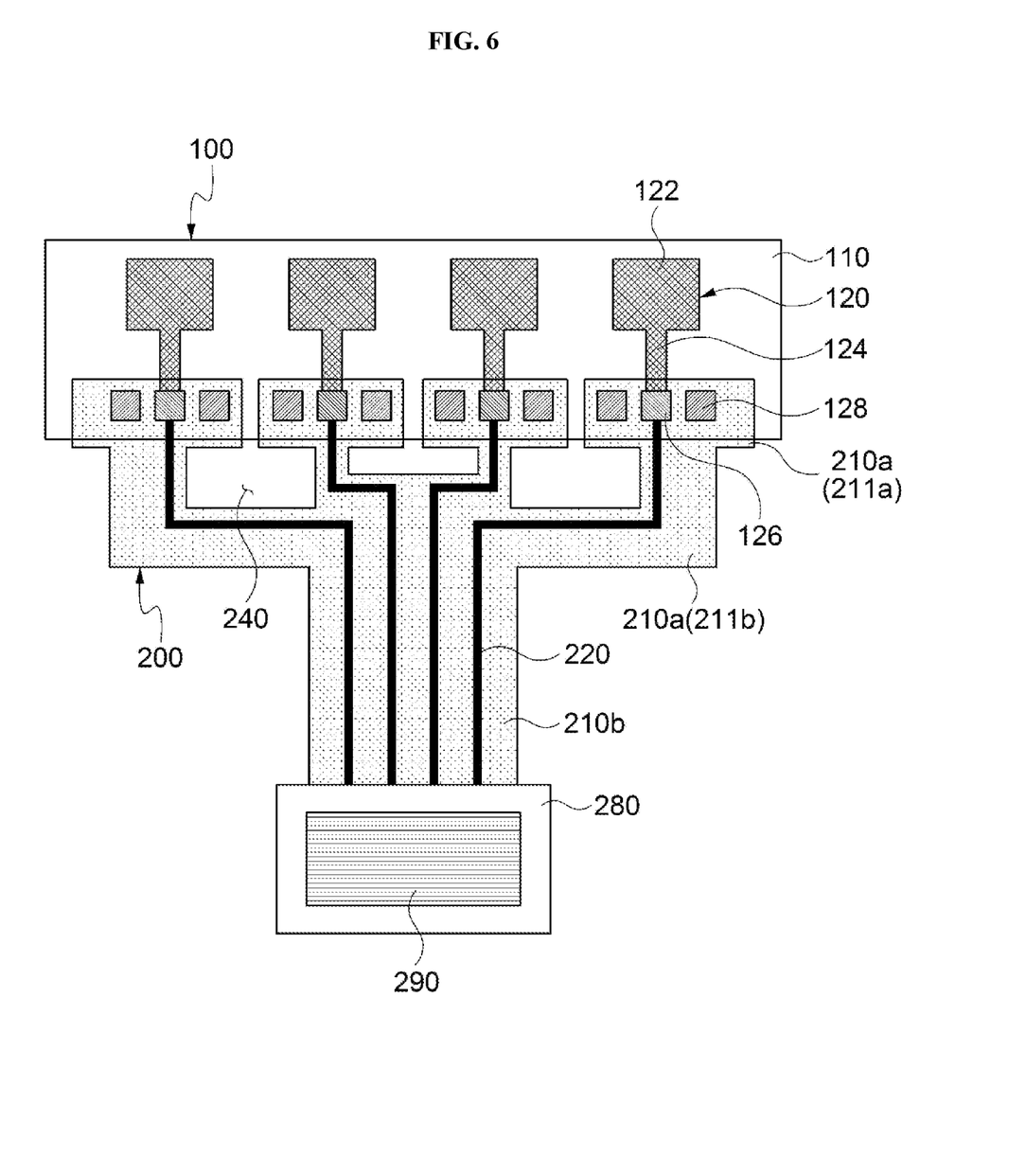
FIGS. 6 to 8 are schematic top planar views illustrating antenna packages in accordance with some exemplary embodiments.
Figure 7:
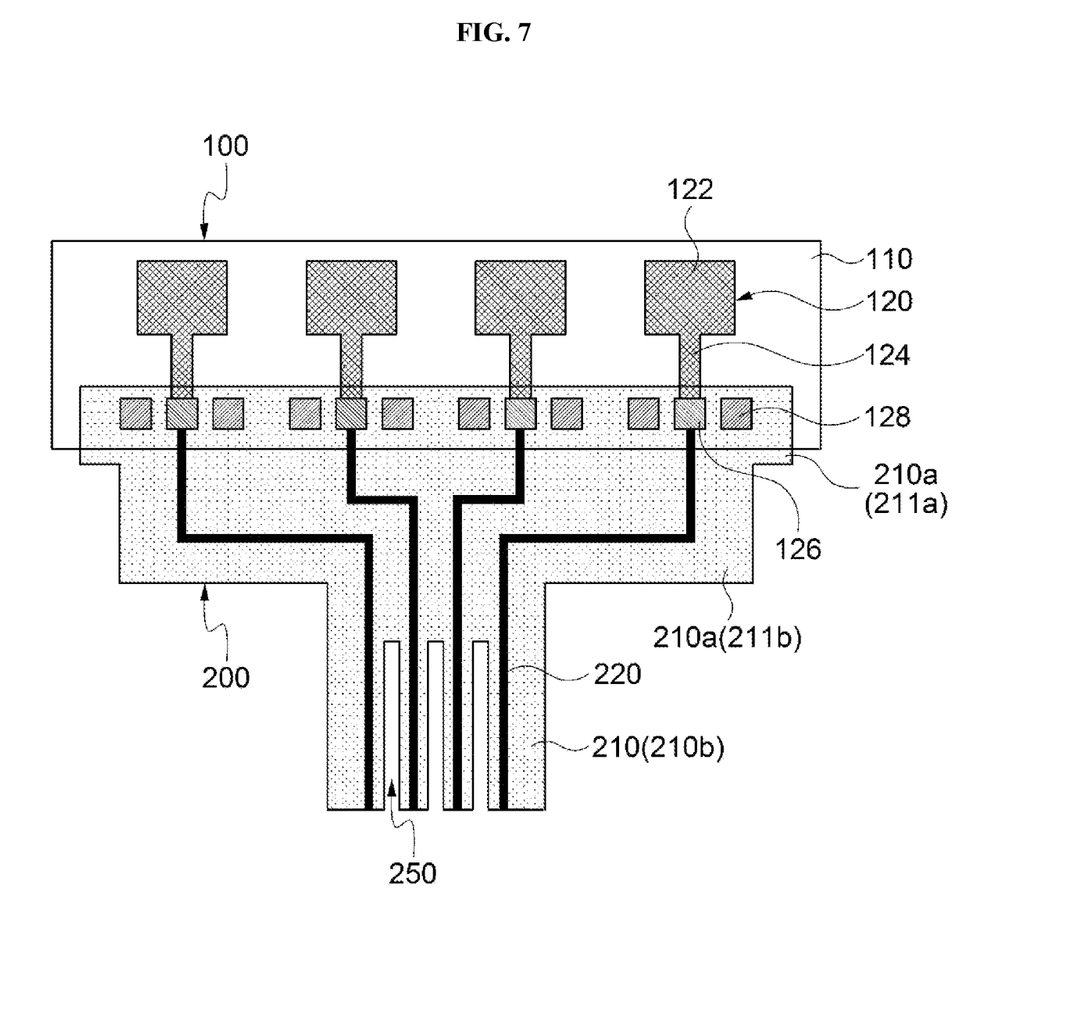
Figure 8:
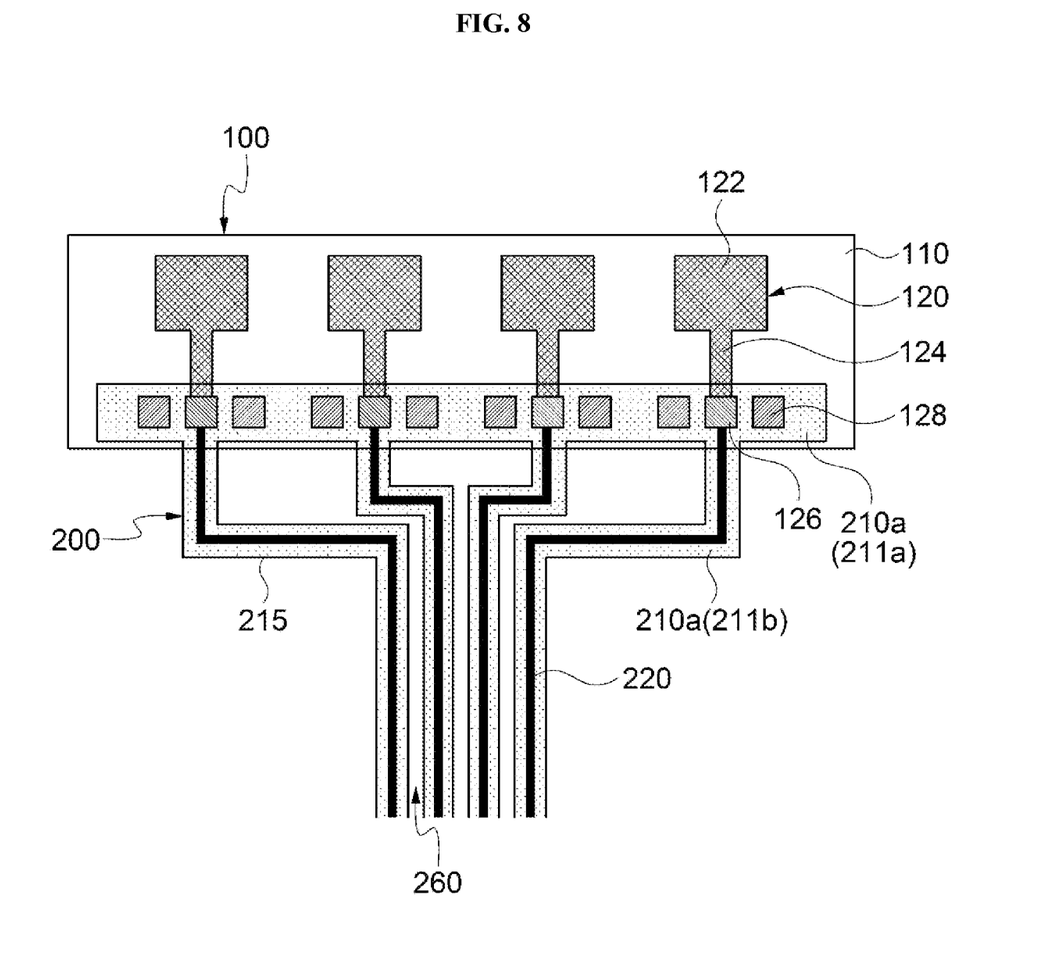

FIGS. 6 to 8 are schematic top planar views illustrating antenna packages in accordance with some exemplary embodiments.

Referring to FIGS. 6 to 8, a portion of the circuit board 200 between the circuit wirings 220 neighboring each other may be removed.

As illustrated in FIG. 6, an opening 240 penetrating the core layer 210 may be formed in the antenna connection portion 210a of the circuit board 200. For example, a plurality of the openings 240 may be formed between portions of the circuit wirings 220 formed on the antenna connection portion 210a.

In some embodiments, the opening 240 may be formed throughout the intermediate portion 211b and the bonding portion 211a, and may extend to an end portion of the circuit board 200.

As illustrated in FIG. 7, a separation slit 250 may be formed in the circuit extension portion 210b of the circuit board 200. For example, a plurality of the separation slits 250 may be formed between portions of the circuit wirings 220 formed on the circuit extension portion 210b. In an embodiment, the separation slit 250 may extend to an opposite end portion of the circuit board 200.

The opening 240 and the separation slit 250 may be formed by cutting or removing a portion of the circuit board 200 between the circuit wirings 220 through a cutting process such as laser cutting. In some embodiments, the ground layer 230 may be removed together with the core layer 210 in the opening 240 and the separation slit 250.

Referring to FIG. 8, an open area 260 may be continuously formed throughout the antenna connection portion 210a and the circuit extension portion 210b. For example, the opening 240 illustrated in FIG. 6 and the separation slit 250 illustrated in FIG. 7 may be merged together to form the open area 260. In this case, the circuit board 200 may include a strip line 215 on which each circuit wiring 220 may independently extend. The strip lines 215 may be separated from each other by the open area 260.

As described with reference to in embodiments illustrated in FIGS. 6 to 8, bending and flexible properties may be further improved by at least partially removing portions of the circuit board 200 between the circuit wirings 220.

Figure 9:
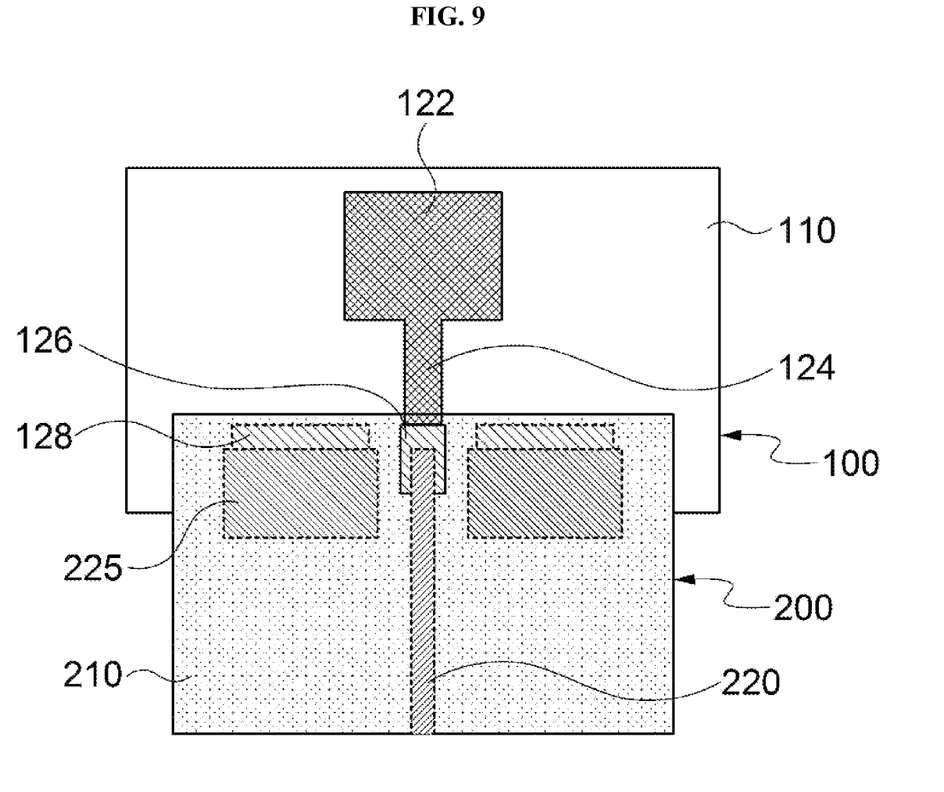
FIG. 9 is a schematic top planar view illustrating an antenna package in accordance with some exemplary embodiments

FIG. 9 is a schematic top planar view illustrating an antenna package in accordance with some exemplary embodiments Referring to FIG. 9, the circuit board 200 may further include a bonding pad 225 formed around the circuit wiring 220. The bonding pad 225 may be included in the antenna connection portion 210a or the bonding portion 211a of the circuit board 200.

The bonding pad 225 may be formed on the first surface 210a (see FIG. 2) of the core layer 210 together with the circuit wiring 220. For example, a pair of the bonding pads 225 may be disposed with one circuit wiring 220 interposed therebetween.

The bonding pad 225 may be electrically and physically separated from the circuit wiring 220, and may be bonded to the ground pad 128 included in the antenna device 100 via the conductive intermediate structure 150 (see FIG. 2). The bonding pad 225 may be included in the bonding region BR of the circuit board 200, so that bonding stability of the circuit board 200 and the antenna device 100 may be further improved.

Figure 10:
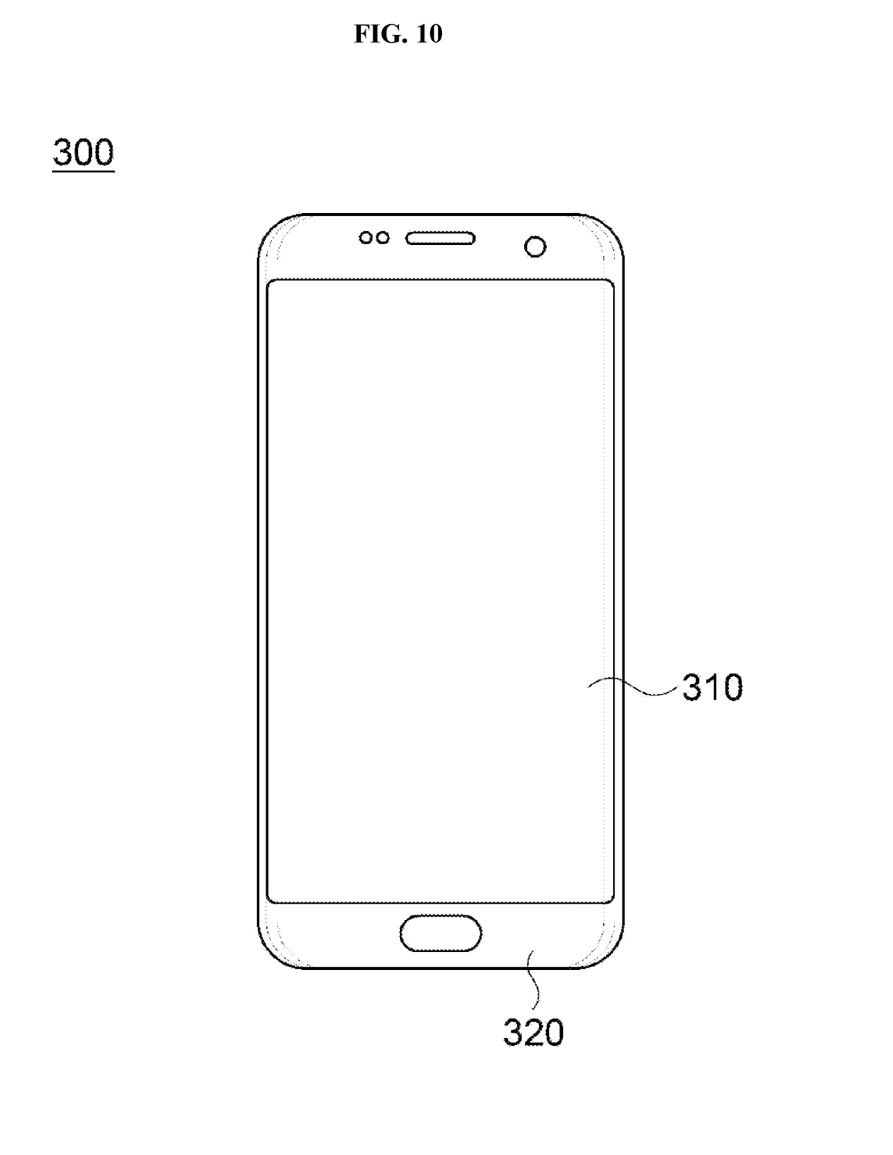
FIG. 10 is a schematic top planar view illustrating an image display device in accordance with exemplary embodiments.

FIG. 10 is a schematic top planar view illustrating an image display device in accordance with exemplary embodiments.

Referring to FIG. 10, an image display device 300 may be fabricated in the form of, e.g., a smart phone, and FIG. 10 shows a front face portion or a window surface of the image display device 300. The front face portion of the image display device 300 may include a display area 310 and a peripheral area 320. The peripheral area 320 may correspond to, e.g., a light-shielding portion or a bezel portion of an image display device.

The antenna device 100 included in the above-described antenna package may be disposed toward the front face portion of the image display device 300, and may be disposed on, e.g., a display panel. In an embodiment, the radiators 122 may be at least partially superimposed over the display area 310 in a planar view.

In this case, the radiator 122 may have a mesh-pattern structure, and a decrease in transmittance due to the radiator 122 may be prevented. The antenna driving IC chip 290 included in the antenna package may be disposed in the peripheral area 320 to prevent degradation of an image quality in the display area 310.

In some embodiments, the antenna package may be bent by the circuit board 200 so that, e.g., the antenna driving IC chip 280 may be disposed at a rear portion of the image display device 300.

As described above, a bending stability in the peripheral area 320 may be improved using the variable width structure of the circuit board 200. Even when the image display device 300 becomes thinner and a bending curvature of the circuit board 200 increases, high-reliability circuit connection may be implemented without mechanical damages of the circuit wiring 220.

What is claimed is:

1. An antenna package comprising:
    an antenna device comprising an antenna dielectric layer and an antenna unit disposed directly on a top surface of the antenna dielectric layer;
    an anisotropic conductive film on a portion of the antenna unit; and
    a circuit board bonded to the antenna unit, the circuit board electrically connected to the antenna unit via the anisotropic conductive film and physically separated from the antenna unit, the circuit board comprising:
a core layer comprising a plurality of portions having different widths from each other in a planar view, the core layer having a first surface and a second surface opposing each other; and
a circuit wiring disposed on the first surface of the core layer and electrically connected to the antenna unit via the anisotropic conductive film,
wherein the antenna unit comprises:
a radiator;
a transmission line extending from the radiator;
a signal pad formed at an end portion of the transmission line and electrically connected to the circuit wiring of the circuit board; and
a ground pad disposed around the signal pad to be separated from the signal pad and the transmission line, wherein the ground pad and the signal pad are disposed at the same level on the top surface of the antenna dielectric layer.

2. The antenna package of claim 1, wherein the core layer comprises an antenna connection portion adjacent to the antenna unit and a circuit extension portion having a width smaller than that of the antenna connection portion.

3. The antenna package of claim 2, wherein the antenna connection portion comprises a bonding portion bonded to the antenna unit, and an intermediate portion disposed between the bonding portion and the circuit extension portion.

4. The antenna package of claim 3, wherein the intermediate portion has a width smaller than that of the bonding portion and has a larger width than that of the circuit extension portion.

5. The antenna package of claim 4, wherein the intermediate portion comprises a first intermediate portion and a second intermediate portion which are sequentially positioned in a direction from the bonding portion to the circuit connection portion; and
the second intermediate portion has a width smaller than that of the first intermediate portion.

6. The antenna package of claim 5, wherein the antenna unit includes a plurality of antenna units;
the circuit wiring includes first merge wirings coupling a predetermined number of antenna units among the plurality of the antenna units to each other, and a second merge wiring coupling the first merge wirings; and
the first merge wirings are disposed on the first intermediate portion, and the second merge wiring is disposed on the second intermediate portion.

7. The antenna package of claim 2, wherein the antenna unit includes a plurality of antenna units; and
the circuit wiring includes a plurality of circuit wirings, each of which is independently connected to each of the plurality of the antenna units to continuously extend on the antenna connection portion and the circuit extension portion.

8. The antenna package of claim 2, wherein the circuit wiring includes a plurality of circuit wirings; and
the circuit board includes an opening formed in the antenna connection portion between the plurality of the circuit wirings.

9. The antenna package of claim 2, wherein the circuit wiring includes a plurality of circuit wirings; and
the circuit board includes a separation slit formed in the circuit extension portion between the plurality of the circuit wirings.

10. The antenna package of claim 2, wherein the circuit board includes an open area continuously formed along the antenna connection portion and the circuit extension portion.

11. The antenna package of claim 10, wherein the circuit wiring includes a plurality of circuit wirings; and
the circuit board includes strip lines separated by the open area, and each of the plurality of the circuit wirings extends in each of the strip lines.

12. The antenna package of claim 2, wherein the circuit wiring includes a plurality of circuit wirings disposed on the first surface of the core layer; and
a distance between circuit wirings neighboring each other is at least three times each width of the plurality of the circuit wirings.

13. The antenna package of claim 1, wherein the circuit wiring includes a plurality of circuit wirings; and
the circuit board further comprises a ground layer formed on the second surface of the core layer to commonly cover the plurality of the circuit wirings in a planar view.

14. The antenna package of claim 1, wherein the circuit board further comprises a bonding pad disposed around the circuit wiring on the first surface of the core layer.

15. The antenna package of claim 14, wherein the bonding pad and the ground pad are bonded to each other.

16. An image display device comprising the antenna package of claim 1.

* * * * *